(12) United States Patent
Su et al.

(10) Patent No.: US 9,640,932 B2
(45) Date of Patent: May 2, 2017

(54) TOOL FOR INSTALLATION AND/OR REMOVAL OF CONNECTOR OR GAS-INSULATED SWITCHGEAR TERMINATION

(75) Inventors: Qi Su, Shanghai (CN); Jinquan Yang, Shanghai (CN); Meng Zhuang, Shanghai (CN); Yong Ding, Shanghai (CN)

(73) Assignee: 3M Innovative Properties Company, St. Paul, MN (US)

( * ) Notice: Subject to any disclaimer, the term of this patent is extended or adjusted under 35 U.S.C. 154(b) by 289 days.

(21) Appl. No.: 14/396,452

(22) PCT Filed: Apr. 27, 2012

(86) PCT No.: PCT/CN2012/074846
§ 371 (c)(1),
(2), (4) Date: Oct. 23, 2014

(87) PCT Pub. No.: WO2013/159346
PCT Pub. Date: Oct. 31, 2013

(65) Prior Publication Data
US 2015/0303636 A1    Oct. 22, 2015

(51) Int. Cl.
*H01R 43/048*    (2006.01)
*H01R 43/20*    (2006.01)
(Continued)

(52) U.S. Cl.
CPC ........... *H01R 43/048* (2013.01); *H01R 43/20* (2013.01); *H01R 43/22* (2013.01); *H01R 43/26* (2013.01);
(Continued)

(58) Field of Classification Search
CPC ...... H01R 43/048; H01R 43/20; H01R 43/22; H01R 43/26; H05K 13/0491
(Continued)

(56) References Cited

U.S. PATENT DOCUMENTS 4,993,132 A    2/1991  Manz
5,365,653 A  * 11/1994  Padrun ............... H05K 13/0491
                                                    29/741

(Continued)

FOREIGN PATENT DOCUMENTS

CN        1825715       8/2006
CN      202059032      11/2011
(Continued)

OTHER PUBLICATIONS

International Search Report for PCT Application No. PCT/CN2012/074846 mailed on Feb. 7, 2013, 5 pages.
European Search Report, 2pgs, dated Oct. 15, 2015.

*Primary Examiner* — A. Dexter Tugbang
(74) *Attorney, Agent, or Firm* — Gregg H. Rosenblatt (57) ABSTRACT

A tool for installation and removal of a connector of a gas-insulated switchgear termination includes a housing defining an operation chamber therein, a mounting assembly selectively disposed in the operation chamber of the housing and adapted for securely installing a sleeve member of a gas-insulated switchgear termination on a conical connector member of the gas-insulated switchgear termination or removing the sleeve member securely sleeved on the conical connector member from the conical connector member, an actuator assembly adapted for actuating motion of the mounting assembly, and a friction reducing assembly adapted for reducing friction and resistance occurring during the motion of the mounting assembly.

20 Claims, 6 Drawing Sheets

(51) Int. Cl.
*H01R 43/26* (2006.01)
*H05K 13/04* (2006.01)
*H01R 43/22* (2006.01)

(52) U.S. Cl.
CPC ........ *H05K 13/0491* (2013.01); *Y10T 29/532* (2015.01); *Y10T 29/53257* (2015.01); *Y10T 29/53274* (2015.01); *Y10T 29/53283* (2015.01)

(58) Field of Classification Search
CPC ............. Y10T 29/532; Y10T 29/53257; Y10T 29/53274; Y10T 29/53283
See application file for complete search history.

(56) References Cited

U.S. PATENT DOCUMENTS

| | | |
|---|---|---|
| 5,575,691 A | 11/1996 | Matthews |
| 7,086,897 B2 | 8/2006 | Montena |
| 7,147,509 B1 | 12/2006 | Burris |
| 2002/0194726 A1 | 12/2002 | Chang |
| 2002/0194728 A1* | 12/2002 | Hathaway ......... Y10T 29/53257 29/828 |
| 2007/0130757 A1 | 6/2007 | Montena |
| 2012/0028499 A1* | 2/2012 | Zraik .................... H01R 43/20 439/584 |

FOREIGN PATENT DOCUMENTS

| | | |
|---|---|---|
| DE | 4241971 | 12/1993 |
| JP | 2005071994 A * | 3/2005 |
| WO | WO 2013-159346 | 10/2013 |

\* cited by examiner

TOOL FOR INSTALLATION AND/OR REMOVAL OF CONNECTOR OR GAS-INSULATED SWITCHGEAR TERMINATION

FIELD OF THE INVENTION

The present invention generally relates to installation tools, and in particular, to a tool for installation and/or removal of a connector of a gas-insulated switchgear termination.

BACKGROUND OF THE INVENTION

With the development of metropolitan, offshore wind parks as well as high speed railway systems, medium and high voltage closed-type combination electrical appliances and switchgear miniaturization applications are becoming widely employed in energy distribution network environments. In these networks, electrical accessories; e.g., gas-insulated cables and terminations, are used in switchgear miniaturization applications. As one of the important electrical accessories that are necessary for energy distribution and supply, gas-insulated switchgear termination (GIS) will have a broad market demand in the coming years. For installation of a connector onto a gas-insulated switchgear termination (GIS), a specialized tool should be employed.

For example, DE4241971 (C1) refers to a contact carrier sleeve compression procedure using hydraulic press, and discloses a compression system. The compression system is used to fit a contact carrier sleeve with a conical inner bore onto a longitudinally slit clamp sleeve with a corresponding external cone at the end of a stripped cable. A hydraulic press has a piston acting on a movable tool abutting the end face of the contact carrier sleeve. A pressure sensor detects the maximum permissible pressure exerted on the contact carrier sleeve, with an independent displacement sensor used to limit the stroke of the hydraulic press tool. By adopting such a compression system, good contact quality is ensured by preventing damage to the contact carrier sleeve. However, this system requires independent sensors for limiting the force exerted on the contact carrier sleeve and the displacement of the hydraulic press tool, resulting in a complicated construction and low portability of the system, due to the hydraulic press tool and the sensors.

Further, in practice, friction and resistance occur upon installation of the connector onto the gas-insulated switchgear termination, and they t are the critical reasons why the compression force exerted on the object, e.g., the contact carrier sleeve, is relatively greater. For example, in the disclosure DE4241971 C1, friction and resistance would be generated between the inner face of the contact carrier sleeve and the external contact surface of the longitudinally slit clamp sleeve, due to unsuitable positioning of the contact carrier sleeve onto the longitudinally slit clamp sleeve and/or the tolerances of the clamp sleeve and the contact sleeve. In such situation, the compression force exerted on contact carrier sleeve is unintentionally enlarged, and this enlarged force may cause breakage of these sleeves.

Furthermore, in practice, in fact, there exists the desire for removal of the connector from the gas-insulated switchgear termination. However, no tool for removal of the connector from the gas-insulated switchgear termination is developed in the prior art.

Accordingly, with the importance of the energy business, there is a need to further develop tools for installation and/or removal of the connector onto/from the gas-insulated switchgear termination (GIS).

SUMMARY OF THE INVENTION

The present invention has been made to overcome or alleviate at least one aspect of the above mentioned disadvantages existing in the conventional technical solutions.

Accordingly, it is an object of at least one embodiment of the present invention to provide a tool for installation and removal of a connector of a gas-insulated switchgear termination, which is portable and is simple to operate.

Accordingly, it is another object of at least one embodiment of the present invention to provide a tool for installation and removal of a connector of a gas-insulated switchgear termination, which may reduce friction and resistance occurring in installation or removal of the connector onto or from the gas-insulated switchgear termination.

Accordingly, it is still another object of at least one embodiment of the present invention to provide a tool for installation and removal of a connector of a gas-insulated switchgear termination, which not only is used for installation of the connector onto the gas-insulated switchgear termination, but also is used for removal of the connector from the gas-insulated switchgear termination.

Further, at least one embodiment of the present invention may provide a tool for installation of a connector onto a gas-insulated switchgear termination, which is portable, simple for operation, and may reduce friction and resistance occurring in installation of the connector onto the gas-insulated switchgear termination.

Furthermore, at least one embodiment of the present invention may provide a tool for removal of a connector from a gas-insulated switchgear termination, which is portable, simple for operation, and may reduce friction and resistance occurring in removal of the connector from the gas-insulated switchgear termination.

According to one aspect of the present invention, there is provided a tool for both installation and removal of a connector of a gas-insulated switchgear termination, which includes a conical connector member for receiving the cable core of electric cable, a sleeve member installed on the conical connector member, and, a locating member being mated with the conical connector member; the tool comprising:

a housing defining an operation chamber therein;

a mounting assembly selectively disposed in the operation chamber of the housing and adapted for securely installing the sleeve member on the conical connector member or removing the sleeve member securely sleeved on the conical connector member from the conical connector member;

an actuator assembly adapted for actuating motion of the mounting assembly; and a friction reducing assembly adapted for reducing friction and resistance occurring during the motion of the mounting assembly.

According to one preferable embodiment of the present invention, wherein the housing further comprises a first half housing part and a second half housing part pivotally joined to the first half housing part such that the operation chamber is defined between the first and second half housing parts.

According to the present invention, wherein the mounting assembly comprises an installation thrust sleeve element selectively and movably disposed inside the operation chamber of the housing, wherein the installation thrust sleeve element comprises a thrust sleeve adapted to at least partially enclose the locating member therein so as to bring the sleeve member to move within the operation chamber during an installation operation of securely installing the sleeve member onto the conical connector member.

The mounting assembly further comprises a remover sleeve element selectively and movably disposed inside the operation chamber of the housing, wherein the remover sleeve element is embodied as a sleeve adapted to at least partially enclose the sleeve member during a removal operation to remove the sleeve member from the conical connector member.

Specifically, the installation thrust sleeve element is embodied as a cylindrically hollow sleeve having a boss at a closed end face thereof and a fitting groove at an open end face thereof. The remover sleeve element is embodied as at least an independent hollow half-ring sleeve.

According to the present invention, the actuator assembly comprises:

a position plate adapted for suitably positioning the installation thrust sleeve element during the installation operation or the conical connector member during the removal operation in the operation chamber; and a driving unit connected the position plate and adapted for converting actuation movement exerted by an actuating spanner (214) during an operation into linear motion of the position plate along a longitudinal axis of the operation chamber of the housing.

The driving unit further comprises: a screw nut element fixedly provided at the top of the housing, and a screw bolt element being in a threaded engagement with the screw nut element; wherein the screw bolt element has one end capable of being detachably connected to the actuating spanner outside the housing and the other end joined to the position plate inside the operation chamber of the housing.

Preferably, the actuating spanner is detachably connected with the driving unit and is able to be driven to run a clockwise and/or counterclockwise motion around the driving unit.

According to the present invention, the friction reducing assembly is provided between the driving unit and the position plate to adjust the positioning of the position plate relative to the driving unit such that the unsuitable positioning of the sleeve member on the conical connector member is effectively eliminated.

The friction reducing assembly at least comprises: a base seat rigidly situated on the position plate, friction reducing elements disposed within the base seat; and, linked means for adjustably linking the screw bolt element to the friction reducing elements.

Specifically, the friction reducing elements further comprise: an axial friction reducing element adapted for reducing an axial friction generated by axial travel of the screw bolt element; and, a radial friction reducing element adapted for reducing a radial friction generated by self-rotation of the screw bolt element.

The linked means for adjustably linking the screw bolt element to the friction reducing elements further comprises: a link rod having one end joined to the screw bolt element and the other end linked to the axial friction reducing element.

It is worthy to be mentioned that the tool of the present invention is preferably made of metal material.

According to another aspect of the present invention, there is provided a tool for installation of a connector of a gas-insulated switchgear termination, which includes a conical connector member for receiving the cable core of electric cable, a sleeve member installed on the conical connector member, and, a locating member being mated with the conical connector member; the tool comprising:

a housing defining an operation chamber therein;

a mounting assembly selectively disposed in the operation chamber of the housing and adapted for securely installing the sleeve member on the conical connector member;

an actuator assembly adapted for actuating motion of the mounting assembly; and a friction reducing assembly adapted for reducing friction and resistance occurring during the motion of the mounting assembly.

According to still another aspect of the present invention, there is provided a tool for removal of a connector of a gas-insulated switchgear termination, which includes a conical connector member for receiving the cable core of electric cable, a sleeve member installed on the conical connector member, and, a locating member being mated with the conical connector member; the tool comprising:

a housing defining an operation chamber therein;

a mounting assembly selectively disposed in the operation chamber of the housing and adapted for removing the sleeve member securely sleeved on the conical connector member from the conical connector member;

an actuator assembly adapted for actuating motion of the mounting assembly; and a friction reducing assembly adapted for reducing friction and resistance occurring during the motion of the mounting assembly.

As apparent from the above, according to the present invention, the tool for installation and removal of a connector of a gas-insulated switchgear termination is portable and simple to operate. Meanwhile, the tool according to the present invention may reduce friction and resistance that may occur in installation or removal of the connector of the gas-insulated switchgear termination. Accordingly, by adoption of this tool, installation and/or removal of the connector of the gas-insulated switchgear termination may be achieved with good contact quality and without any unintentional damage. Moreover, problems with fit tolerance between the sleeve member and the conical connector member are eliminated. Additionally, the tool for installation and removal of a connector of a gas-insulated switchgear termination is not only is used for installation of the connector onto the gas-insulated switchgear termination, but also is used for removal of the connector from the gas-insulated switchgear termination. Alternatively, the present invention may either provide a tool for installation of a connector onto a gas-insulated switchgear termination, or provide a tool for removal of a connector from a gas-insulated switchgear termination.

BRIEF DESCRIPTION OF THE DRAWINGS

These and/or other aspects and advantages of the invention will become apparent and more readily appreciated from the following description of the embodiments, taken in conjunction with the accompanying drawings of which.

The scope of the present invention will in no way be limited to the simply schematic views of the drawings, the number of constituting components, the materials thereof, the shapes thereof, the relative arrangement thereof, etc., and are disclosed simply as an example of an embodiment.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Figure 1:
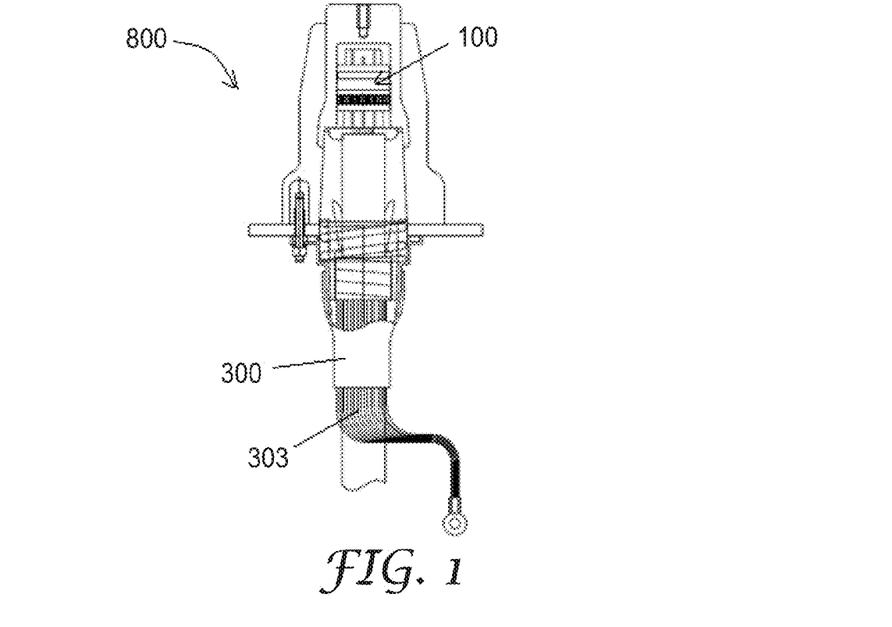
FIG. 1 is a schematic view of a gas-insulated termination employed in a gas-insulated switchgear miniaturization application.
Figure 2:
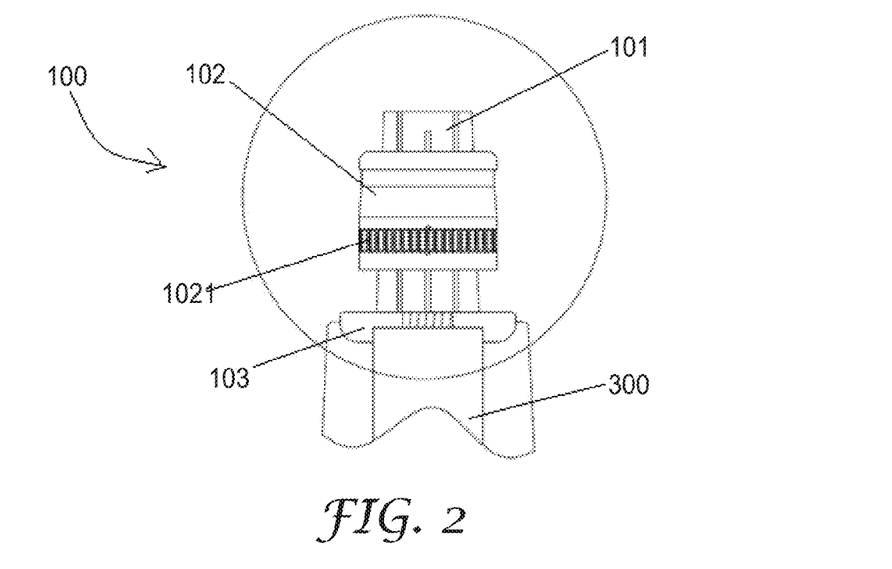
FIG. 2 is a partially enlarged schematic view of the gas-insulated termination in FIG. 1, illustrating a metal connector in the gas-insulated termination.
Figure 3:
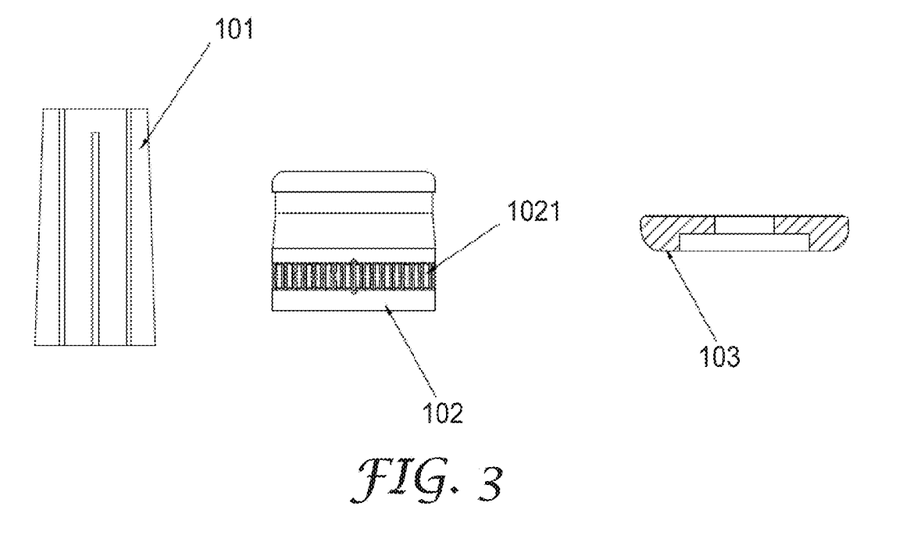
FIG. 3 shows components of a connector assembly employed in the gas-insulated termination, including a conical connector member, a sleeve member, and a position plate.
Figure 10:
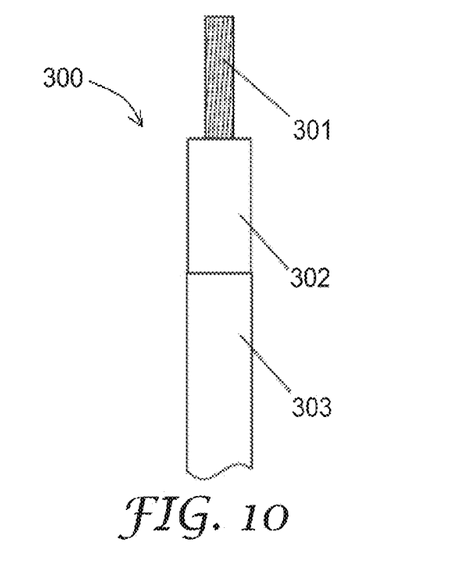
FIG. 10 shows an electric cable used for the gas-insulated termination.

FIG. 1 shows a schematic view of a gas-insulated switchgear termination 800 employed in a gas-insulated switchgear miniaturization application, and, FIG. 2 is a partially enlarged schematic view of the gas-insulated termination in FIG. 1, showing a metal connector 100 in the gas-insulated switchgear termination 800. Specifically, the gas-insulated switchgear termination 800, which aims to provide power transmission, mainly includes electric cable 300 with cable core 301, and a metal connecter 100 attached to the electric cable 300, wherein the electric cable 300 comprises cable core 301, cable insulation layer 302 and cable shielding layer 303 (as shown in FIG. 10). As shown in FIG. 3, the metal connecter 100 at least comprises a conical connector member 101 with an internal bore through which the stripped cable core 301 passes, a sleeve member 102 with scale 1021, and a locating member 103. Particularly, in an assembled gas-insulated termination 800, the sleeve member 102 is securely sleeved on the conical connector member 101 to hold the stripped cable core 301 passing therethrough, and, the locating member 103 is mated with the conical connector member 101.

Figure 4:
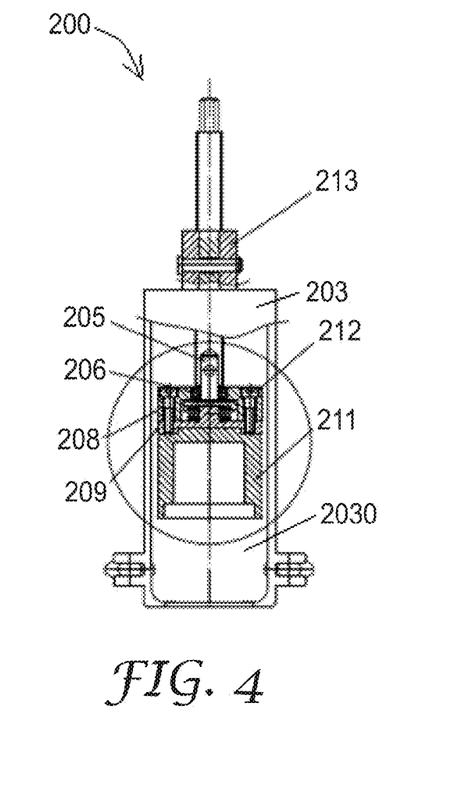
FIG. 4 is a schematic view of a tool for installation and removal of a connector of a gas-insulated switchgear termination according to a preferred embodiment of the present invention, showing an installation thrust sleeve selectively disposed in the tool, for an installation operation.

Referring to FIGS. 4-9, the present invention provides a tool 200 for installation and removal of a connector of a gas-insulated switchgear termination 800. More specifically, the present invention provides a tool 200 for installing the sleeve member 102 onto the conical connector member 101 and/or removing the sleeve member 102 securely sleeved on the conical connector member 101 from the latter. FIG. 4 shows the tool 200 for installation and removal of the connector of the gas-insulated switchgear termination 800 according to a preferred embodiment of the present invention, in which an installation thrust sleeve 211 is selectively disposed in the tool 200, for an operation of securely installing the sleeve member 102 onto the conical connector member 101 (that is also referred as "an installation operation"); and, FIG. 8 also shows the tool 200 for installation and removal of a connector of a gas-insulated switchgear termination 800 according to the preferred embodiment of the present invention, in which a removal sleeve 210 is selectively disposed in the tool 200, for an operation of removing the sleeve member 102 from the conical connector member 101 (that is also referred as "a removal operation").

Referring to FIGS. 4 to 9, the tool 200 for installation and removal of a connector of a gas-insulated switchgear termination 800 mainly comprises a housing 203 defining an operation chamber 2030 therein, a mounting assembly, actuator assembly, and friction reducing assembly. The mounting assembly is adapted for securely installing the sleeve member 102 onto the conical connector member 101 or removing the sleeve member 102 sleeved on the conical connector member 101 from the conical connector member 101. The actuator assembly is adapted for actuating motion of the mounting assembly. The friction reducing assembly is adapted for reducing friction between the mounting assembly and the sleeve member 102 during the motion of the mounting assembly.

Figure 6:
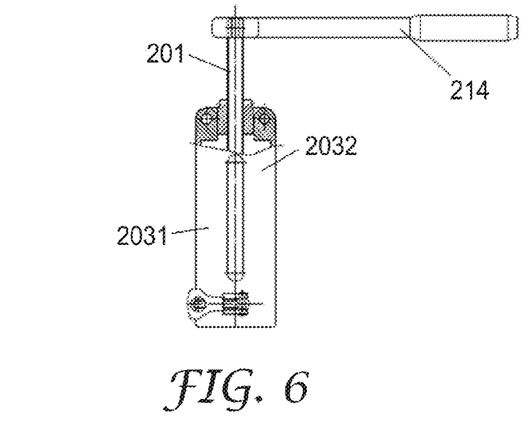
FIG. 6 is another schematic view of the tool for installation and removal of a connector of a gas-insulated switchgear termination.
Figure 7:
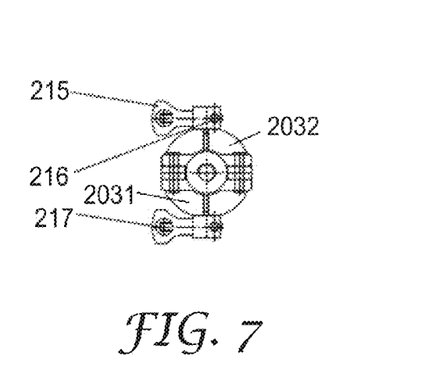
FIG. 7 is a top view of the tool for installation and removal of a connector of a gas-insulated switchgear termination of FIG. 4.

According to a preferred embodiment of the present invention shown in FIGS. 4, 6 and 7, the housing 203 is constituted by first and second half housing parts 2031, 2032, and a longitudinal operation chamber 2030 is defined in the housing 203. As shown in FIGS. 6 and 7, the actuator assembly is arranged at the upper part of the longitudinal housing 203, and at the upper part of the longitudinal housing 203, the first and second half housing parts 2031, 2032 of the housing 203 are pivotally joined together by a pin shaft 202 (shown in FIG. 8), while, at the lower part of the longitudinal housing 203, there provides means for coupling the first and second half housing parts 2031, 2032 of the housing 203 together. In detail, the coupling means includes a pair of pin shafts 216, and a pair of collar nuts 215 each with a drop bolt 217. In an alternative embodiment, any other suitable means for coupling the first and second half housing parts 2031, 2032 of the housing 203 may be adopted.

Figure 5:
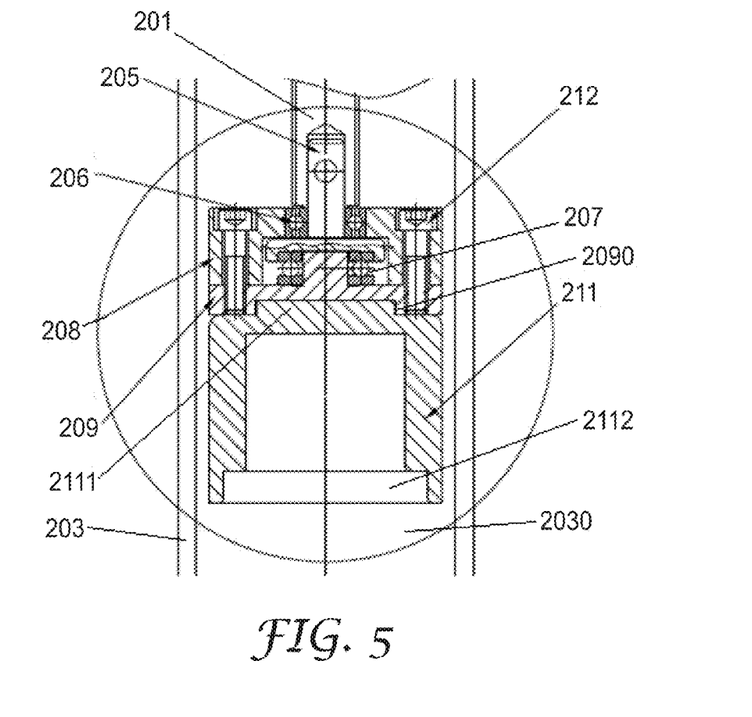
FIG. 5 is a partially enlarged schematic view of the tool for installation and removal of a connector of a gas-insulated switchgear termination in FIG. 4.
Figure 8:
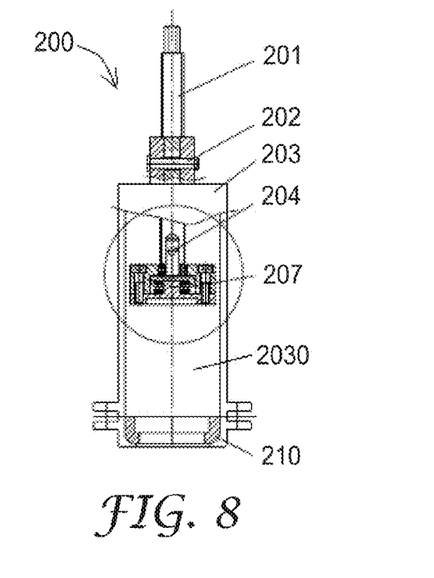
FIG. 8 is a schematic view of a tool for installation and removal of a connector of a gas-insulated switchgear termination according to a preferred embodiment of the present invention, showing a removal sleeve selectively disposed in the tool, for a removal operation.
Figure 13:
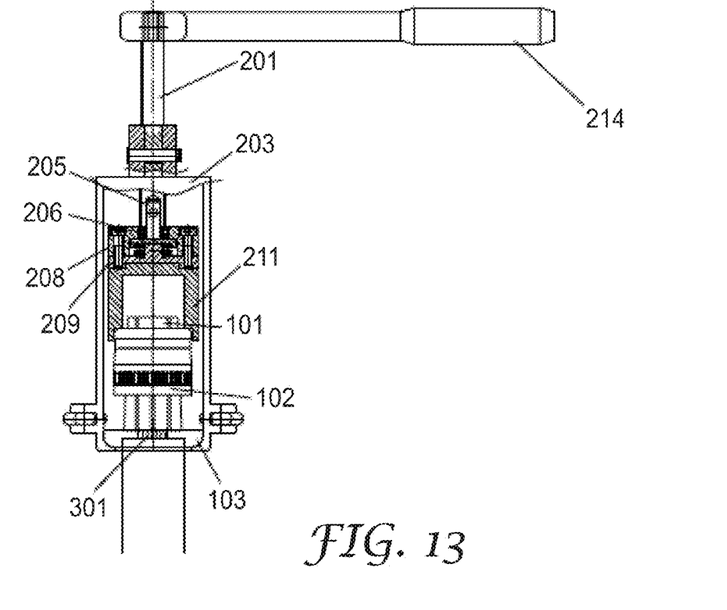
FIG. 13 shows an installation operation for installing the connector onto the gas-insulated switchgear termination by the tool according to a preferred embodiment of the present invention.
Figure 14:
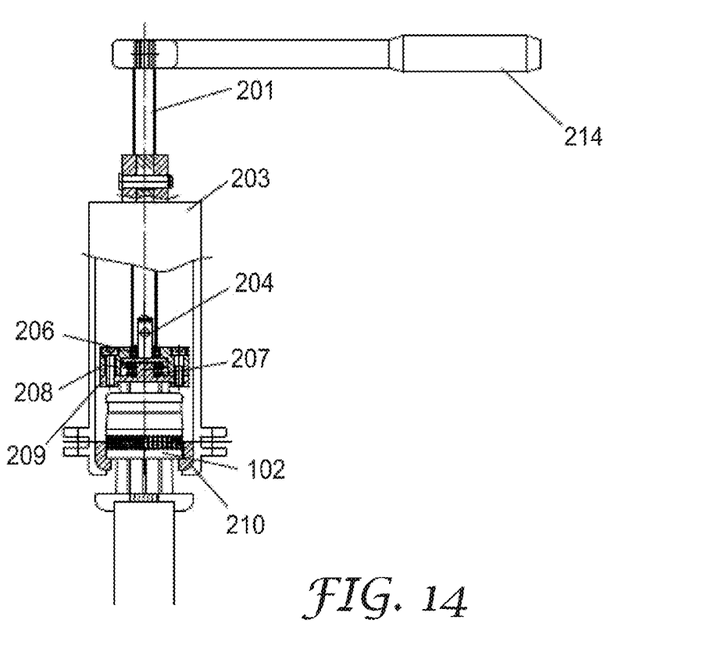
FIG. 14 shows a removal operation for removing the connector from the gas-insulated switchgear termination by the tool according to a preferred embodiment of the present invention.

According to the present invention, the mounting assembly is removably disposed in the longitudinal operation chamber 2030 of the housing 203 and is adapted for securely installing the sleeve member 102 onto the conical connector member 101 or removing the sleeve member 102 sleeved on the conical connector member 101 from the conical connector member 101. The mounting assembly includes an installation thrust sleeve element 211 (see FIG. 4) and a remover sleeve element 210 (see FIG. 8). The installation thrust sleeve element 211 and the remover sleeve element 210 are selectively disposed inside the operation chamber 2030 of the housing 203. That is, either the installation thrust sleeve element 211 is selected to be disposed inside the operation chamber 2030 of the housing 203 in order for the installation operation (see FIG. 4), or, the remover sleeve element 210 is selected to be disposed inside the operation chamber 2030 of the housing 203 in order for the removal operation (see FIG. 8). Referring to FIG. 13 of the drawings, the installation thrust sleeve element 211 comprises a thrust sleeve adapted to enclose the top portion of the sleeve member 102 so as to allow the sleeve member 102 and the locating member 103 to move toward each other within the operation chamber 2030 during an installation operation of securely installing the sleeve member 102 onto the conical connector member 101. Specifically, according to the preferred embodiment of the present invention, as shown in FIG. 5 of the drawings, the installation thrust sleeve element 211 is embodied as a cylindrically hollow thrust sleeve 211 having a boss 2111 at a closed end face thereof and a fitting groove 2112 at an open end face thereof. The boss 2111 of the thrust sleeve 211 is adapted to be fitted to an internal recessed face 2090 of a position plate 209 (which will be described in detail hereinafter) of the actuator assembly. Preferably, the depth of the hollow thrust sleeve 211 is more than ½ of the length of the conical connector member 101. Referring to FIG. 14 of the drawings, the remover sleeve element 210 comprises a sleeve adapted to at least partially enclose the sleeve member 102 during a removal operation to remove the sleeve member 102 from the conical connector member 101. Specifically, according to the preferred embodiment of the present invention, as shown in FIG. 8 of the drawings, the remover sleeve element 210 is embodied as a pair of independent hollow half-ring sleeves mated with each other. The mated sleeve 210 is adapted to be fitted to the bottom face of the sleeve member 102, in order for removing the sleeve member 102 from the conical connector member 101.

According to the present invention, the actuator assembly is adapted for actuating the motion of the mounting assembly. Referring to FIGS. 4, 6 and 8, the actuator assembly mainly includes a position plate 209 adapted for suitably positioning the installation thrust sleeve element 211 during the installation operation or the conical connector member 101 during the removal operation into the operation chamber 2030, and a driving unit connected to the position plate 209 and adapted for converting actuation movement exerted by an actuating spanner 214 during an operation into linear motion of the position plate 209 along a longitudinal axis of the operation chamber 2030 in the housing 203. Specifically, as shown in FIGS. 4 and 6, the driving unit further comprises a screw nut element 213, e.g., a T-type screw nut, provided at the top of the housing 203 by means of a pin member 202 (see FIG. 8), and a screw bolt element 201, e.g., a T-type screw bolt, being in a threaded engagement with the screw nut element 213, wherein the screw bolt element 201 has one end capable of being detachably connected to the actuating spanner 214 outside the housing 203 and the other end joined to the position plate 209 inside the operation chamber 2030 of the housing 203. According to the present embodiment, referring to FIG. 6, the actuating spanner 214 is detachably connected with the screw bolt element 201 and is able to be driven to run a clockwise and/or counterclockwise motion around the screw bolt element 201. It should be noted that, the actuating spanner 214 may either be provided together with the tool 200 according to the present invention, or be provided as an independent part besides the tool 200 according to the present invention. Further, an internal recessed face 2090 of the position plate 209 is suitable to be in contact with the installation thrust sleeve element 211 during the installation operation or with the conical connector member 101 during the removal operation such that the installation operation or the removal operation is actuated by the linear motion of the position plate 209 along the longitudinal axis of the operation chamber 2030.

Figure 9:
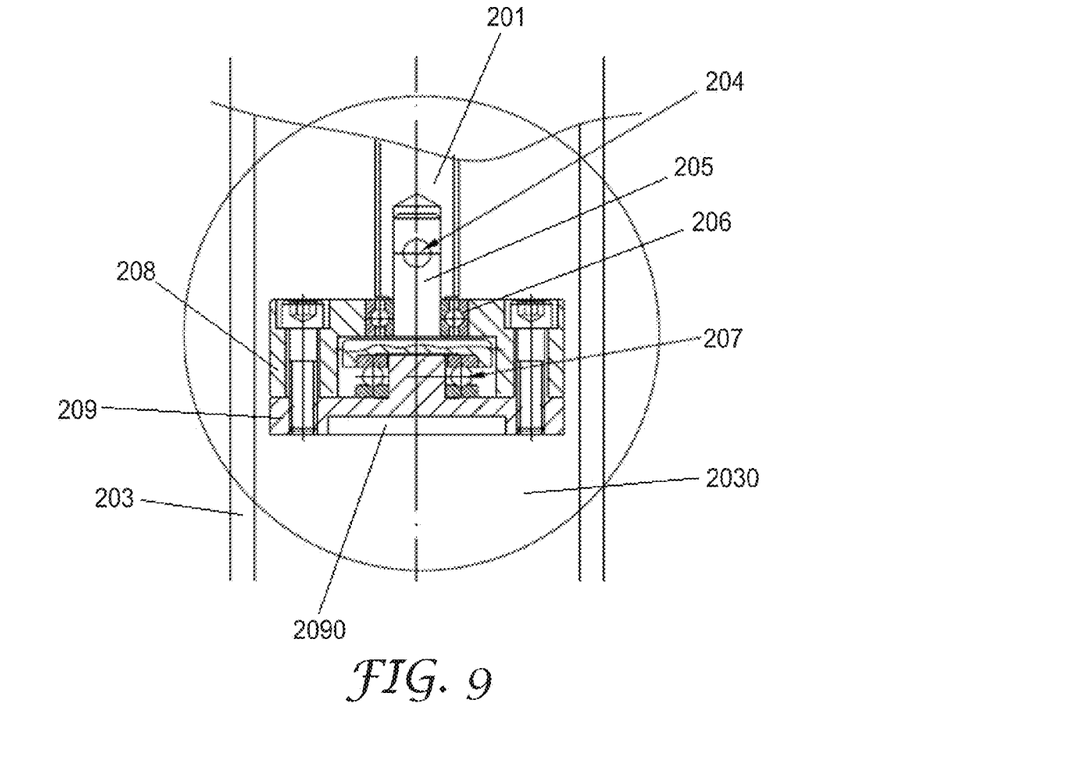
FIG. 9 is a partially enlarged schematic view of the tool for installation and removal of a connector of a gas-insulated switchgear termination in FIG. 8.

According to the present invention, in order for reducing friction and resistance between the mounting assembly and the sleeve member 102 during the installation operation and the removal operation, the friction reducing assembly is provided. Referring to FIGS. 5 and 9, the friction reducing assembly is provided between the screw bolt element 201 of the driving unit and the position plate 209 to adjust the positioning of the position plate 209 relative to the screw bolt element 201 such that the unsuitable positioning of the sleeve member 102 onto the conical connector member 101 is effectively eliminated. Specifically, the friction reducing assembly mainly comprises a base seat 208, friction reducing elements 206, 207 disposed within the base seat 208, and, linked means for adjustably linking the screw bolt element 201 to the friction reducing elements 206, 207. Specifically, referring to FIGS. 5 and 9, the base seat 208, e.g., a bearing seat, is rigidly situated on the position plate 209. The friction reducing elements comprise an axial friction reducing element 207, e.g., a single thrust bearing, adapted for reducing an axial friction generated by axial travel of the screw bolt element 201; and, a radial friction reducing element 206, e.g., a deep groove ball bearing, adapted for reducing a radial friction generated by self-rotation of the screw bolt element 201. Furthermore, linked means for adjustably linking the screw bolt element 201 to the friction reducing elements 206, 207 further comprises a link rod 205 having one end joined to the screw bolt element 201 by mean of a locating pin 204 (see FIG. 8) and the other end linked to the axial friction reducing element 207 by means of fastener 212, e.g., a screw member.

It is worthy to be mentioned that, according to the present invention, the tool, 200 including the housing 203 and these assemblies, i.e., the mounting assembly, the actuator assembly, and the friction reducing assembly, is preferably made of metal material, such as, iron, aluminum, alloy, and the like. Alternatively, any other materials may be adopted.

Next, referring to FIGS. 10-14 of the drawings, operations of the tool 200 for installation and removal of a connector of a gas-insulated switchgear termination according to the present invention will be described in detail.

FIG. 10 shows a known electric cable 300 ready to be incorporated into the gas-insulated switchgear termination 800. The electric cable 300 comprises cable core 301, cable insulation layer 302, and cable shielding layer 303. As shown in FIG. 10, one end of the electric cable 300 is stripped and the cable core 301 is exposed.

Figure 11:
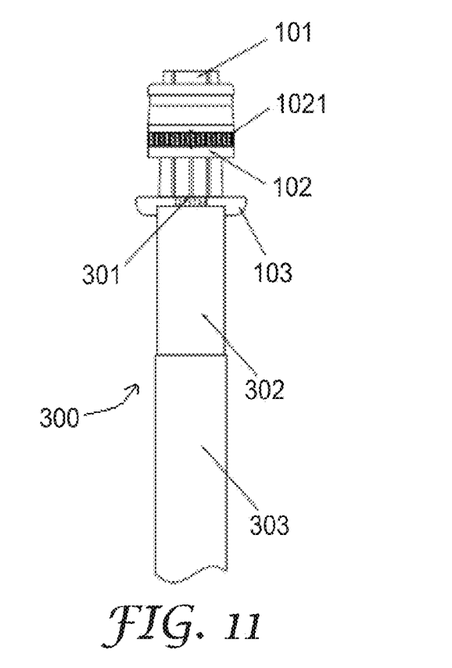
FIG. 11 shows a pre-installed connector assembly on the electric cable of FIG. 10, being ready for an installation operation.

Referring to FIGS. 11 and 13, installation operation of installing a connector onto the gas-insulated switchgear termination 800 according to the present invention is described.

Before use of the tool 200 for installation and removal of a connector of a gas-insulated switchgear termination according to the present invention, as shown in FIG. 11, first, the locating member 103 is pushed onto the stripped cable core 301 of the electric cable 300 until the locating member 103 butts up against the end face of the cable insulation layer 302, so as to leave the cable core 301 to be ready for the installation operation; then, the conical connector member 101 is placed onto the cable core 301; finally, the sleeve member 102 is pressed onto the conical connector member 101 with the internal peripheral surface of the sleeve member 102 being in contact with external peripheral surface of the conical connector member 101, such that the sleeve member 102 is not fully pressed onto the conical connector member 101, as shown in FIG. 11.

Figure 12:
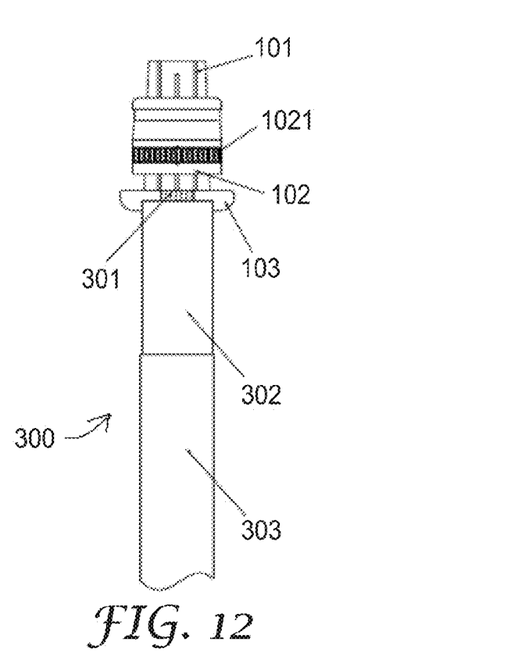
FIG. 12 shows an already installed connector assembly on the electric cable of FIG. 10, being ready for a removal operation.

As shown in FIG. 13, the installation thrust sleeve element 211 is now placed in the operation chamber 2030 of the housing 203, with the boss 2111 of the installation thrust sleeve element 211 positioned in the internal recessed face 2090 of the position plate 209; meanwhile, the electric cable 300 sleeved with the sleeve member 102 and the conical connector member 101 is placed in the operation chamber 2030 of the housing 203, with the locating member 103 located at one longitudinal end of the operation chamber 2030 opposing the placement of the installation thrust sleeve element 211. Then, the operation chamber 2030 of the housing 203 is closed by combining the first and second half housing parts 2031, 2032. Next, the actuating spanner 214 is turned in a clockwise direction, and the installation thrust sleeve element 211 is moved with the linear motion of the position plate 209 along the longitudinal axis to press the sleeve member 102 onto the conical connector member 101, until completing the maximum possible displacement of the sleeve member 102 onto the conical connector member 101. The resulting configuration is illustrated in FIG. 12. During the above installation operation, the axial friction reducing element 207 would reduce an axial friction generated by axial travel of the screw bolt element 201, and the radial friction reducing element 206 would reduce a radial friction generated by self-rotation of the screw bolt element 201.

Also, referring to FIGS. 12 and 14, the operation of removing the connector from the gas-insulated switchgear termination 800 according to the present invention is described.

FIG. 12 shows the electric cable 300 with the stripped cable core 301, in which the sleeve member 102 has been pressed onto the conical connector member 101 with the maximum possible displacement.

By now, as shown in FIG. 14, to place the remover sleeve element 210 in the operation chamber 2030 of the housing 203; meanwhile, to dispose the electric cable 300 sleeved with the sleeve member 102 and the conical connector member 101 in the maximum possible displacement into the operation chamber 2030 of the housing 203 along its longitudinal axis.] The sleeve member 102 is located between the sleeve member 102 and the position plate 209. Then, to close the operation chamber 2030 of the housing 203 by combining the first and second half housing parts 2031, 2032. Next, to run the actuating spanner 214 in a clockwise direction, and the position plate 209 is driven by the screw bolt element 201 to move along the longitudinal axis to push the sleeve member 102 away from locating member 103 and upward along the conical connector member 101. During the above removal operation, the axial friction reducing element 207 would reduce an axial friction generated by axial travel of the screw bolt element 201, and the radial friction reducing element 206 would reduce a radial friction generated by self-rotation of the screw bolt element 201.

Thermal stability against short circuit and dynamic stability against short circuit are two main parameters to test the connection effect of electric conductors, and both China state standard GB/T 12706 and IEC 60502 have such requirements. Table. 1 shows the results of experimental tests using the tool 200 for installation and removal of a connector of a gas-insulated switchgear termination on multiple electric cables respectively according to the present invention, in which each electric cable to be used has a core sectional area of 240 $mm^2$, applied in the application circumstance with Nominal Voltage of 26/35 kV.

TABLE 1

| Example | 1 | 2 | 3 | 4 | 5 |
| --- | --- | --- | --- | --- | --- |
| Thermal short-circuit test | 32 kA, 2 s Pass | 32 kA, 2 s Pass | 32 kA, 2 s Pass | 32 kA, 2 s Pass | 32 kA, 2 s Pass |
| Dynamic short-circuit test | 113 kA, >10 ms Pass | 113 kA, >10 ms Pass | 113 kA, >10 ms Pass | 113 kA, >10 ms Pass | 113 kA, >10 ms Pass |
| Installation torque (N · m) | 60 | 60 | 60 | 60 | 60 |
| Removal torque (N · m) | 47 | 45 | 45 | 44 | 43 |

As seen from Table. 1, by adoption of the tool 200 for installation and removal of a connector of a gas-insulated switchgear termination, the installation torque required in the installation operations of installing the connector onto the gas-insulated switchgear termination is no less than 60 N.m, and, the removal torque required in the removal operations of removing the connector from the gas-insulated switchgear termination is no more than 47 N.m It is worthy to be mentioned that, it would be appreciated by those skilled in the art that, the present invention not only provide a tool for both installation and removal of a connector of a gas-insulated switchgear termination, but also provide a tool for only installation of a connector onto a gas-insulated switchgear termination and/or a tool for only removal of a connector from a gas-insulated switchgear termination.

Concerning the above, according to the present invention, the tool for installation and removal of a connector of a gas-insulated switchgear termination is portable and simple to operate. Meanwhile, the tool according to the present invention may reduce friction and resistance which may occur during installation or removal of the connector of the gas-insulated switchgear termination. Accordingly, by adoption of this tool, installation and/or removal of the connector of the gas-insulated switchgear termination may be achieved with good contact quality and without any unintentionally damage. Moreover, problems with fite tolerance between the sleeve member and the conical connector member are eliminated. Additionally, the tool for installation and removal of a connector of a gas-insulated switchgear termination is not only used for installation of a connector onto a gas-insulated switchgear termination, but also is used for removal of a connector from a gas-insulated switchgear termination. Alternatively, the present invention may either provide a tool for installation of a connector onto a gas-insulated switchgear termination, or provide a tool for removal of a connector from a gas-insulated switchgear termination.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. Tool for installation and removal of a connector of a gas-insulated switchgear termination, which includes a conical connector member for receiving the cable core of electric cable, a sleeve member installed on the conical connector member, and, a locating member being mated with the conical connector member; said tool comprising:
   a housing defining an operation chamber in the housing;
   a mounting assembly selectively disposed in said operation chamber of said housing and adapted for securely installing the sleeve member on the conical connector member or removing the sleeve member securely sleeved on the conical connector member from the conical connector member;
   an actuator assembly adapted for actuating motion of said mounting assembly; and
   a friction reducing assembly adapted for reducing friction and resistance occurring during the motion of said mounting assembly.

2. The tool according to claim 1, wherein said housing further comprises a first half housing part and a second half housing part pivotally joined to said first half housing part such that said operation chamber is defined between said first and second half housing parts.

3. The tool according to claim 1, wherein said mounting assembly comprises an installation thrust sleeve element selectively and movably disposed inside said operation chamber of said housing, wherein said installation thrust sleeve element comprises a thrust sleeve adapted to at least partially enclose the sleeve member therein so as to cause the sleeve member to move within said operation chamber during an installation operation of securely installing the sleeve member onto the conical connector member.

4. The tool according to claim 3, wherein said mounting assembly further comprises a remover sleeve element selectively and movably disposed inside said operation chamber of said housing, wherein said remover sleeve element is embodied as a sleeve adapted to at least partially enclose the sleeve member during a removal operation to remove the sleeve member from the conical connector member.

5. The tool according to claim 4, wherein said remover sleeve element is embodied as at least an independent hollow half-ring sleeve.

6. The tool according to claim 3, wherein said installation thrust sleeve element is embodied as a cylindrically hollow sleeve having a boss at a closed end face of the cylindrically hollow sleeve and a fitting groove at an open end face of the cylindrically hollow sleeve.

7. The tool according to claim 1, wherein said actuator assembly comprises:
   a position plate adapted for suitably positioning said installation thrust sleeve element during said installation operation or said conical connector member during said removal operation in said operation chamber; and
   a driving unit connected to said position plate and adapted for converting actuation movement exerted by an actuating spanner during an operation into linear motion of said position plate along a longitudinal axis of said operation chamber of the housing.

8. The tool according to claim 7, wherein said driving unit further comprises:
   a screw nut element fixedly provided at the top of said housing, and
   a screw bolt element being in a threaded engagement with said screw nut element;
   wherein said screw bolt element has one end capable of being detachably connected to the actuating spanner outside said housing and the other end joined to said position plate inside said operation chamber of said housing.

9. The tool according to claim 8, wherein the actuating spanner is detachably connected with the driving unit and is able to be driven to run in a clockwise and/or counterclockwise motion around said driving unit.

10. The tool according to claim 7, wherein said friction reducing assembly is provided between said driving unit and said position plate to adjust the positioning of said position plate relative to said screw bolt element such that an unsuitable positioning of said sleeve member on the conical connector member is effectively eliminated.

11. The tool according to claim 10, wherein said friction reducing assembly at least comprises:
   a base seat rigidly situated on said position plate,
   friction reducing elements disposed within said base seat; and,
   linked means for adjustably linking said screw bolt element to said friction reducing elements.

12. The tool according to claim 11, wherein said friction reducing elements further comprise:
   an axial friction reducing element adapted for reducing an axial friction generated by axial travel of said screw bolt element; and,
   a radial friction reducing element adapted for reducing a radial friction generated by self-rotation of said screw bolt element.

13. The tool according to claim 11, wherein said linked means for adjustably linking said screw bolt element to said friction reducing elements further comprises:
   a link rod having one end joined to said screw bolt element and the other end linked to said axial friction reducing element.

14. A tool for installation of a connector of a gas-insulated switchgear termination, which includes a conical connector member for receiving a cable core of electric cable, a sleeve member installed on the conical connector member, and, a locating member being mated with the conical connector member; said tool comprising:
   a housing defining an operation chamber in the housing;
   a mounting assembly selectively disposed in said operation chamber of said housing and adapted for securely installing the sleeve member on the conical connector member;
   an actuator assembly adapted for actuating motion of said mounting assembly; and
   a friction reducing assembly adapted for reducing friction and resistance occurring during the motion of said mounting assembly.

15. The tool according to claim 14, wherein said mounting assembly comprises an installation thrust sleeve element selectively and movably disposed inside said operation chamber of said housing during an installation operation of securely installing the sleeve member onto the conical connector member.

16. The tool according to claim 15, wherein said installation thrust sleeve element is embodied as a cylindrically hollow sleeve having a boss at a closed end face of the cylindrically hollow sleeve and a fitting groove at an open end face of the cylindrically hollow sleeve.

17. The tool according to claim 14, wherein said actuator assembly comprises:
   a position plate adapted for suitably positioning said installation thrust sleeve element during said installation operation; and a driving unit connected said position plate and adapted for converting actuation movement exerted by an actuating spanner during an operation into linear motion of said position plate along a longitudinal axis of said operation chamber of the housing.

18. A tool for removal of a connector of a gas-insulated switchgear termination, which includes a conical connector member for receiving a cable core of electric cable, a sleeve member installed on the conical connector member, and, a locating member being mated with the conical connector member; said tool comprising:

a housing defining an operation chamber in the housing;

a mounting assembly selectively disposed in said operation chamber of said housing and adapted for removing the sleeve member securely sleeved on the conical connector member from the conical connector member;

an actuator assembly adapted for actuating motion of said mounting assembly; and a friction reducing assembly adapted for reducing friction and resistance occurring during the motion of said mounting assembly.

19. The tool according to claim 18, wherein said mounting assembly comprises a remover sleeve element selectively and movably disposed inside said operation chamber of said housing during a removal operation of removing the sleeve member from the conical connector member.

20. The tool according to claim 18, wherein said actuator assembly comprises:

a position plate adapted for suitably positioning said conical connector member during said removal operation in said operation chamber; and a driving unit connected said position plate and adapted for converting actuation movement exerted by an actuating spanner during an operation into linear motion of said position plate along a longitudinal axis of said operation chamber of the housing.

* * * * *